US009666410B2

(12) United States Patent
Kakinuma et al.

(10) Patent No.: US 9,666,410 B2
(45) Date of Patent: May 30, 2017

(54) CHARGED PARTICLE BEAM DEVICE

(71) Applicant: Hitachi High-Technologies Corporation, Minato-ku, Tokyo (JP)

(72) Inventors: Takefumi Kakinuma, Tokyo (JP); Kazuyuki Hirao, Tokyo (JP); Ayana Yamamoto, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/961,331

(22) Filed: Dec. 7, 2015

(65) Prior Publication Data
US 2016/0172154 A1    Jun. 16, 2016

(30) Foreign Application Priority Data

Dec. 15, 2014    (JP) ................. 2014-252586

(51) Int. Cl.
*H01J 37/28*    (2006.01)
*H01J 37/304*    (2006.01)
*H01J 37/22*    (2006.01)

(52) U.S. Cl.
CPC ............ *H01J 37/222* (2013.01); *H01J 37/28* (2013.01); *H01J 2237/24578* (2013.01); *H01J 2237/24592* (2013.01)

(58) Field of Classification Search
CPC ................. H01J 37/28; H01J 37/304
USPC .................................. 250/310, 311
See application file for complete search history.

(56) References Cited

U.S. PATENT DOCUMENTS 6,373,054 B2 * 4/2002 Hiroi ............... H01J 37/28
250/307

FOREIGN PATENT DOCUMENTS

JP    5043741 B2    10/2012

* cited by examiner

*Primary Examiner* — David A Vanore
(74) *Attorney, Agent, or Firm* — Crowell & Moring LLP

(57) ABSTRACT

Proposed is a charged particle beam device including an arithmetic processing unit that generates an image of a sample, based on a detection signal that is detected based on irradiation to the sample with a charged particle beam emitted from a charged particle source. The arithmetic processing unit searches a second image as a search target image with use of a first image as a template, and when a region corresponding to the first image is not detected in the second image, the arithmetic processing unit searches a third image that represents a region larger than a region displayed in the second image, with use of a second template.

5 Claims, 9 Drawing Sheets

CHARGED PARTICLE BEAM DEVICE

CLAIM OF PRIORITY

The present application claims priority from Japanese patent application JP 2014-252586 filed on Dec. 15, 2014, the content of which is hereby incorporated by reference into this application.

BACKGROUND OF THE INVENTION

1. Field of the Invention

The present invention relates to a charged particle beam device, and in particular, relates to a charged particle beam device that implements a pattern matching process used for identifying a desired position of a pattern.

2. Description of the Related Art

In a charged particle beam device or the like, a pattern matching a method is used to accurately set a position of the field of view or a measurement position of a fine measurement or a fine inspection target pattern. The pattern matching method evaluates correlation values at various positions between a reference image referred to as a template and an image acquired by a charged particle beam device so as to identify a pattern with the template. Such a position identifying method is also referred to as addressing, and is used for searching a measurement target pattern or an inspection target pattern that has a known positional relationship with an addressing pattern. Japanese Patent No. 5043741 describes a technique of updating a template in such a manner that it is determined whether or not a pattern pre-registered as a recipe and intended for addressing is appropriate as an addressing pattern, and when it is determined that the pattern is inappropriate, an optimum addressing pattern is selected from a scanning electron microscope (SEM) image acquired at low magnification, and an SEM image region including the selected pattern is cut as a template.

As described above, an SEM used for measuring and inspecting a semiconductor is controlled by an operation program referred to as a recipe. As a result, a process that optimizes a recipe as described in Japanese Patent No. 5043741 is very important for highly accurate measurement and high throughput of measurement. On the other hand, the process that optimizes a recipe consumes certain time. It is desired to provide a device that suppresses such processing time as much as possible and realizes highly accurate and high-throughput measurement. In order to adequately continue measurement and inspection processes without a change in a condition of addressing and the like, it is desirable to include a process that suppresses occurrence of an addressing error during measurement and inspection. However, Japanese Patent. No. 5043741 does not describe such a process.

Hereinafter, a charged particle beam device that is aimed at maintaining a high success rate of a pattern search in the course of a pattern search is proposed. Further, a charged particle beam device that is aimed at positioning the field of a view in a measurement target pattern or an inspection target pattern without pre-registration of a template intended for addressing is proposed.

SUMMARY OF THE INVENTION

As an aspect to achieve the above object, the present invention proposes a charged particle beam device, including: an arithmetic processing unit that generates an image of a sample, based on a detection signal that is detected based on irradiation to the sample with a charged particle beam emitted from a charged particle source, wherein the arithmetic processing unit searches a second image as a search target image with use of a first image as a template, and when a region corresponding to the first image is not detected in the second image, the arithmetic processing unit searches a third image that represents a region larger than a region displayed in the second image, with use of the second image or a second template formed based on the second image.

Further, as another aspect to achieve the above object, the present invention proposes a charged particle beam device, including: an arithmetic processing unit that generates an image of a sample, based on a detection signal that is detected based on irradiation to the sample with a charged particle beam emitted from a charged particle source, wherein the arithmetic processing unit creates a template, based on a first image that is generated based on a detection signal obtained by scanning with the charged particle beam, searches a second image that represents a region larger than a region displayed in the first image, with use of the template, and determines an irradiation position movement signal of the charged particle beam, based on a deviation between a first position detected by the search and a pre-registered second position.

According to the above-described aspect, a high success rate of a pattern search can be maintained in a pattern search using a template. Further, according to the above-described another aspect, the field of a view can be brought closer to a desired position without implementation of addressing.

When an addressing error occurs at a time of recipe implementation in measurement or inspection of a semiconductor pattern, the recipe is updated in order to adequately identify a measurement position (MP). The updating of the recipe consumes a long time and large effort even when an experienced operator carries out the updating of the recipe. When there are many measurement points to be evaluated, work time of an operator increases. Moreover, in order to obtain information necessary for the recipe updating, a sample is irradiated with an electron beam. In this case, a charge amount of the sample increases. Moreover, the device is occupied for a long time by the optimizing process for the recipe.

The following embodiments describe a charged particle beam device capable of suppressing frequency of recipe updating and maintaining a high success rate of addressing.

In one of embodiments described below, wide region data on a region that includes a measurement point set on a semiconductor pattern is acquired in advance. Next, when addressing is failed at a time of recipe implementation, a captured image is matched with the wide region data. An addressing position on the wide region data acquired in advance is identified from a matching position, and a position of addressing on the device is relatively identified.

According to the above-described configuration, it becomes possible to suppress a possibility that an addressing error occur at a time of recipe implementation.

DESCRIPTION OF THE PREFERRED EMBODIMENTS

Hereinafter, embodiment s will be described with reference to the drawings.

[Embodiment 1]

Figure 1:
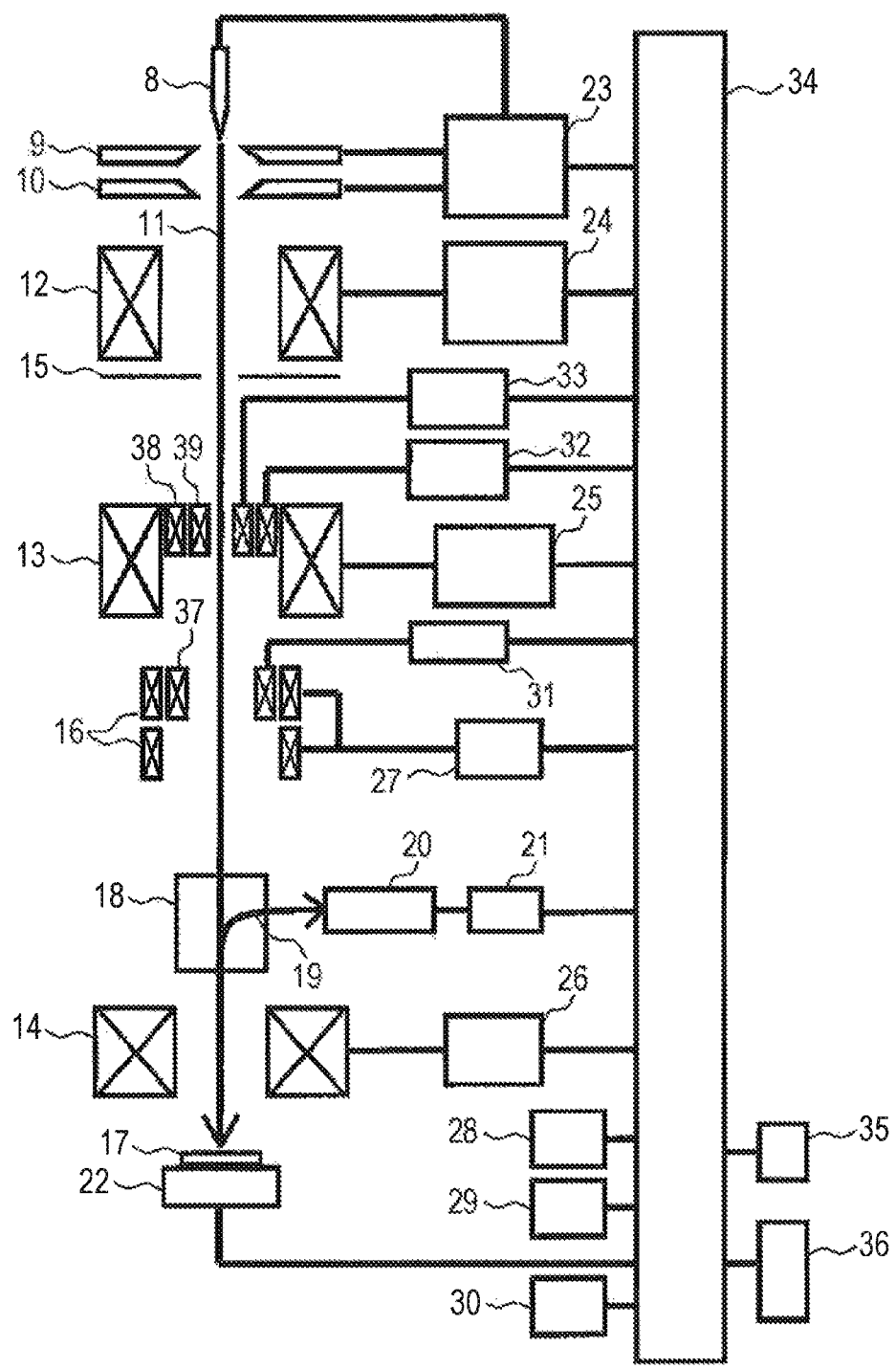
FIG. 1 is a view showing an outline of a scanning electron microscope.

FIG. 1 is a view describing an outline of a scanning electron microscope. The scanning electron microscope according to the present embodiment includes a cathode 8, a first anode 9, a second anode 10, a convergence lens 12, a diaphragm plate 15, a convergence lens 13, a scanning coil 16, a secondary-signal-separation orthogonal electromagnetic field (EXB) generator 18, and an objective lens 14. A single-staged deflection coil 37 is disposed in the vicinity of or at the same position as the scanning coil 16. The deflection coil 37 operates as an objective lens adjuster that corrects misalignment of the objective lens 14.

Moreover, an astigmatism correction coil 38 and an adjuster 39 are disposed in the vicinity of or at the same position as the convergence lens 13. The astigmatism correction coil 38 is a multi-pole coil for correcting astigmatism in X and Y directions. The adjuster 39 functions as on astigmatism correction coil adjuster that corrects misalignment of the astigmatism correction coil 38.

The scanning electron microscope according to the present embodiment further includes a secondary signal detector 20, a signal amplifier 21, an image memory 28, an image display unit 29, an image processing unit 30, a computer 34, an input unit 35, and a storage unit 36.

The scanning electron microscope according to the present embodiment further includes a high voltage control power supply 23, a first convergent lens control power supply 24, a second convergent lens control power supply 25, objective lens control power supply 26, a scanning coil control power supply 27, an objective lens adjuster control power supply 31, an astigmatism correction coil control power supply 32, and an astigmatism correction coil adjuster control power supply 33. These power supplies are controlled by the computer 34.

A voltage is applied between the cathode 8 and the first anode 9 by the high voltage control power supply 23. As a result, a primary electron beam 11 of a predetermined emission current is extracted from the cathode 8. An acceleration voltage is applied between the cathode 8 and the second anode 10 by the high voltage control power supply 23. As a result, the primary electron beam 11 is accelerated and travels to a lens section disposed downstream thereof. The primary electron beam 11 is converged by the convergence lens 12. Unnecessary electrons of the primary electron beam 11 are removed by the diaphragm plate 15. The primary electron beam 11 is converged by the convergence lens 13. The primary electron beam 11 is converged by the objective lens 14 as a small spot on a sample 17 held on a sample stage 22. The sample stage 22 is provided with a drive mechanism (not shown) that drives the sample stage 22, based on coordinate information described in a pre-registered recipe. The drive mechanism is controlled based on an irradiation position movement signal (when the stage is used, this signal supplied to the drive mechanism) that is output from a computer or an arithmetic processing unit described below.

The objective lens 14 can have one of various structures such as an in-lens structure, an out-lens structure, and a snorkel structure (semi in-lens structure). Moreover, in the scanning electron microscope according to the present embodiment, the objective lens 14 may have a retarding structure that applies a voltage to a sample so as to decelerate the primary electron beam. Further, the convergence lens may be a static lens composed of a plurality of electrodes.

The sample 17 is two-dimensionally scanned with the primary electron beam 11 by the scanning coil 16. When the sample 17 is irradiated with the primary electron beam, secondary electrons and the like are generated from the sample 17. A secondary signal 19 generated from the sample 17 travels to an upper portion of the objective lens 14. Subsequently, the secondary signal 19 is separated from the primary electrons by the secondary-signal-separation orthogonal electromagnetic field (EXB) generator 18, and is detected by the secondary signal detector 20. The signal detected by the secondary signal detector 20 is amplified by the signal amplifier 21. Subsequently, the signal is transferred to the image memory 28. The image display unit 29 displays an image transferred to the image memory 28, as a sample image. Moreover, in addition to a scanning signal, a deflection signal for moving the field of view (FOV) can be supplied to the scanning coil 16. Such movement of the field of view is also referred to as an image shift, and as controlled based on an irradiation position movement signal that is output from the computer or the arithmetic processing unit described below (the image shift is controlled based on a voltage applied to the deflector or a current that is supplied). Note that an image shift deflector and a scanning deflector may be separate deflectors.

The single-staged deflection coil 37 (objective lens adjuster) is disposed in the vicinity of or at the same position as the scanning coil 16. The deflection coil 37 operates as an adjuster that corrects misalignment of the objective lens 14. Moreover, the multi-pole astigmatism correction coil 38 for correcting astigmatism in the X and Y direction is disposed between the objective lens 14 and the diaphragm plate 15. The adjuster 39 (astigmatism correction coil adjuster) that corrects misalignment of the as correction coil is disposed in the vicinity of or at the same position as the astigmatism correction coil 38 controlled by the astigmatism correction coil control power supply 32. The objective lens adjuster 37 is controlled by the objective lens adjuster control power supply 31. The astigmatism correction coil adjuster 39 is controlled by the astigmatism correction coil adjuster control power supply 33. The image processing unit 30, the storage unit 36, and the input unit 35 are also connected to the computer 34.

The image memory 28, the image display unit 29, the image processing unit 30, the computer 34, the input unit 35, and the storage unit 36 implement the following process that optimizes addressing for a recipe. The process that optimizes addressing for a recipe is configured as a program executable by the computer 34. A recipe and various patterns, a template image, design data, an SEM image, an imaging condition, an optical condition, and the like are stored in the storage unit 36.

Figure 9:
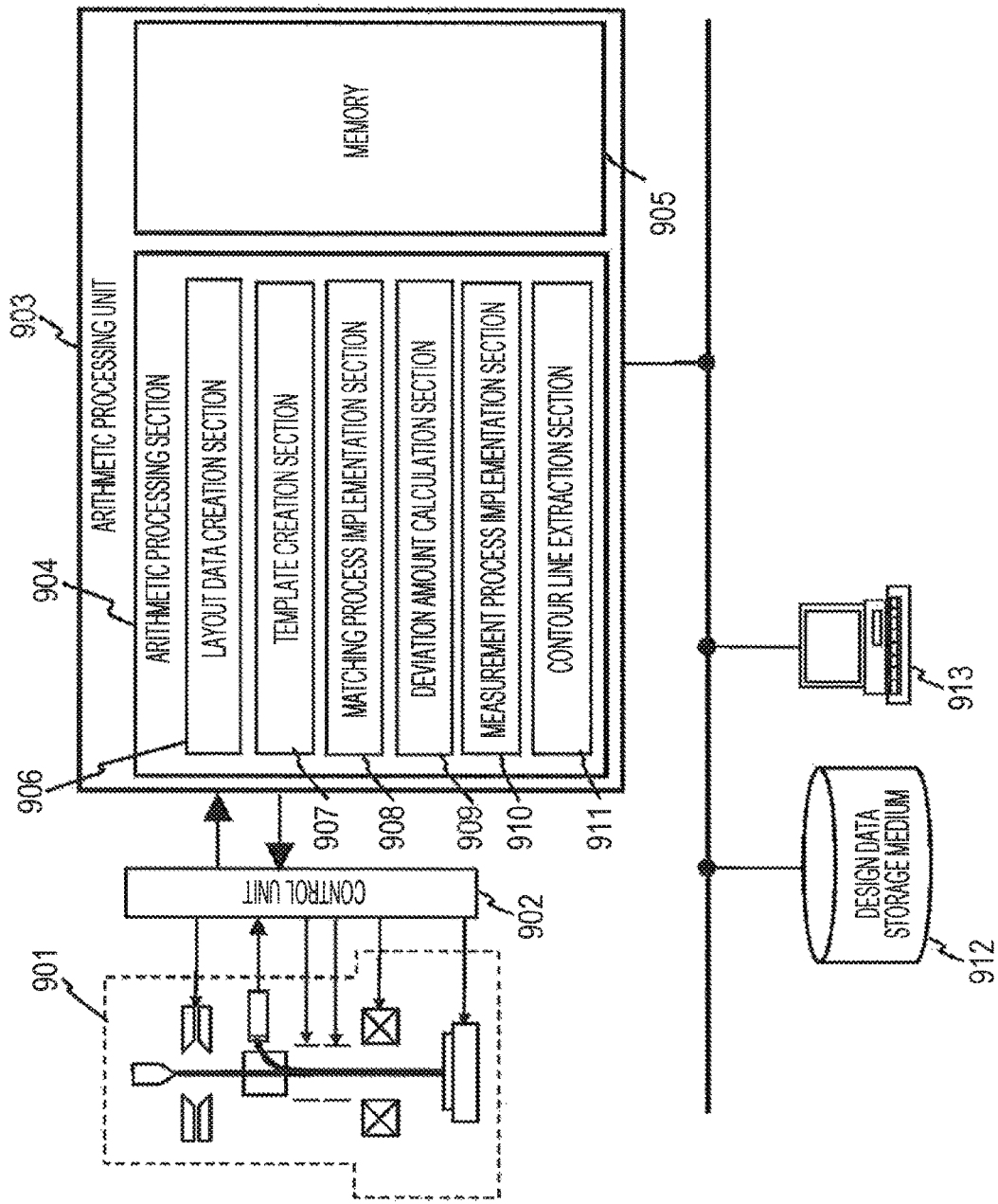
FIG. 9 is a view showing an example of a measurement system including a scanning electron microscope.

FIG. 9 is a view showing an example of a measurement system including a scanning electron microscope. The system includes a scanning electron microscope system that includes an SEM main body 901, a control unit 902 of the SEM main body, and an arithmetic processing unit 903. An arithmetic processing section 904 that supplies a predetermined control signal to the control unit 902 and that implements a process for a signal obtained by the SEM main body 901, and a memory 905 that stores obtained image information and recipe information are built in the arithmetic processing unit 903. Note that, in the present embodiment, the control unit 902 and the arithmetic processing unit 903 are explained as separate units, but these units may be an integrated control unit.

Electrons emitted from a sample irradiated with a beam deflected by the deflector or electrons emitted from a conversion electrode are detected by a detector. The electrons are converted into a digital signal by an A/D converter built in the control unit 902. An image process appropriate for a purpose is implemented by image processing hardware such as a CPU, an ASIC, and an FPGA built in the arithmetic processing unit 903.

The arithmetic processing section 904 includes a layout data creation section 906 that creates layout data that represents an arrangement of a semiconductor device pattern, based on design data stored in a design data storage medium 912. The layout data creation section 906 converts vector data stored in the design data storage medium 912 into layout data that represents disposition and a shape of a pattern. Moreover, the arithmetic processing section 904 includes a template creation section 907 that creates a template intended for template matching, from an image formed based on a detection signal obtained by the SEM main body, or an image obtained based on the above-described layout data. Further, the arithmetic processing section 904 includes a matching process implementation section 908 that implements a matching process using a created template.

The matching process implementation section 908 implements a search for a search target image with use of a template, determines correlation values of individual sites of the search target image and the template, and detects positions where correlation values satisfy a predetermined condition (for example, the highest correlation values or correlation values exceeding a predetermined value) as matching positions.

A deviation amount calculation section 909 calculates a deviation between a matching position and a predetermined position that is pre-registered. The deviation calculation is implemented by calculation of a distance between two points on an image, and determines a deflection signal of the image shift deflector and a stage drive signal that cancel the deviation. Moreover, a measurement process implementation section 910 generates a waveform profile, based on a signal detected by the detector, and measures a pattern size, based on the generated waveform profile or based on a signal waveform obtained by linear differentiation or quadratic differentiation of the signal waveform.

A contour line extraction section 911 thins edges of an SEM image so as to extract contour lines of a pattern of the SEM image. Contour lines are formed in such a manner that luminance profiles that are perpendicular to edge points are formed and peaks of the luminance profiles are connected.

A display unit provided with an input unit 913 connected to the arithmetic processing unit 903 via a network displays a graphic user interface (GUT) that displays an image, a measurement result, and the like to an operator.

Note that part or all of control and processes in the arithmetic processing unit 903 may be allocated to a CPU, a computer, or the like that has a memory that stores images. Moreover, the input unit 913 also functions as an imaging recipe creation unit that sets a measurement condition including coordinates of an electronic device required for measurement, inspection, and the like, a type of a pattern, and an imaging condition (an optical condition and a stage movement condition), as an imaging recipe. Moreover, the input unit 913 also includes a function of collating input coordinate information and pattern type information with layer information and pattern identification information of design data, and reading out necessary information in the design data storage medium 912.

Design data stored in the design data storage medium 912 is described in a predetermined format such as GDS format or an OASIS format. Moreover, a type of the design data is not restricted as long as it can be displayed and treated as graphic data by software. Moreover, the graphic data may be line segment image information that is deformed as a real pattern by an exposure simulation, instead of line segment image information that represents an ideal shape of a pattern formed based on the design data.

Figure 2:
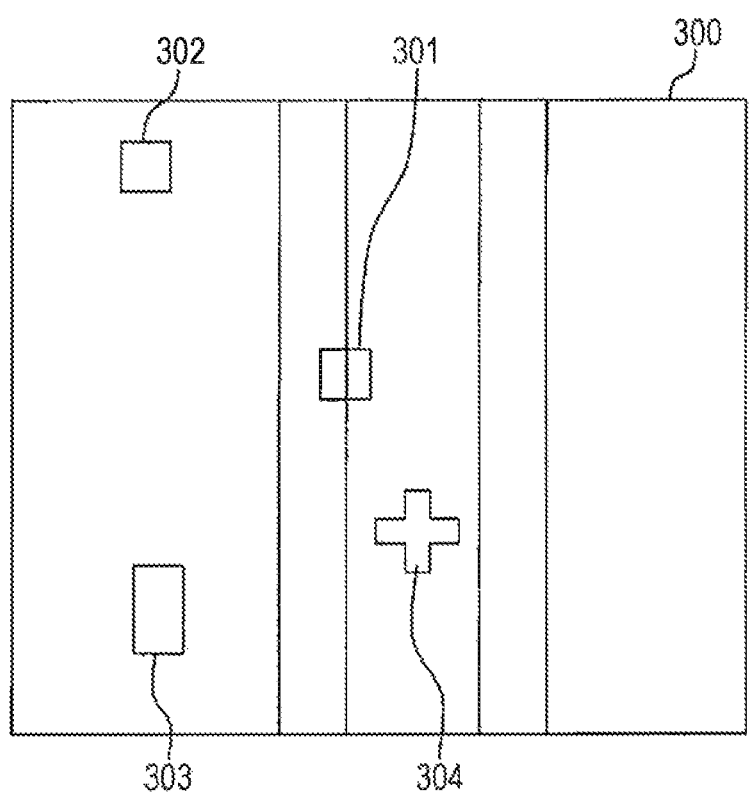
FIG. 2 is a view showing an example of a pattern image as a measurement target or an inspection target.

FIG. 2 shows an example of an image 300 of a wiring pattern used for inspecting a semiconductor pattern. When the wiring pattern is inspected, in addition to a measurement point (MP) 301 that is an evaluation target, an addressing point or addressing pattern 302, an auto-focus point or auto-focus pattern 303, and an auto-stigma point or auto-stigma pattern 304 are used.

The measurement point 301 that is an evaluation target in a wiring pattern is preset. It is difficult to search a low magnification image for the measurement point 301. Thus, a feature pattern, a feature shape, or the like that can be found easily is set in the vicinity of the measurement point 301. The feature pattern, the feature shape, or the like is the addressing pattern 302. A deviation. (coordinates) between the addressing pattern 302 and the measurement point 301 is known. Addressing is a process that searches for the addressing pattern 302, and arrives at the measurement point 301 from the addressing pattern 302. First, a relatively low magnification wide image is searched for the addressing pattern 302. Next, the field of view is moved on a relatively high magnification image by a predetermined deviation. As a result, an image having the measurement point 301 at the center of the field of view is obtained.

The auto-focus pattern 303 is a pattern used for implementing an auto-focus adjustment. Moreover, the auto stigma pattern 304 is a pattern used for implementing an auto-stigma adjustment. Generally, the auto-focus adjustment and the auto-stigma adjustment are implemented at points other than the measurement point 301. This is because when a measurement point is repeatedly irradiated with an electron beam, a surface of a sample is damaged. In order to avoid such damage, the auto-focus pattern 303 and the auto-stigma pattern 304 are set at points different from the measurement point 301. A deviation (coordinates) between the auto-focus pattern 303 and the measurement point 301, and a deviation (coordinates) between the auto-stigma pattern 304 and the measurement point 301 are pre-registered.

The measurement point 301, the addressing pattern 302, the auto-focus pattern 303, and the auto-stigma pattern 304 are referred to as imaging points. Coordinates of these imaging points, a size and a shape of a pattern, an imaging sequence, an imaging condition, and a template image of the addressing pattern 302 are managed as an imaging recipe.

A deviation between an addressing pattern and a measurement point is obtained in such a manner that an SEM image of an addressing pattern that has known coordinates and is pre-registered as a template is compared with an SEM image (real imaging template) captured in a real imaging sequence, and their deviation is determined.

Figure 3:
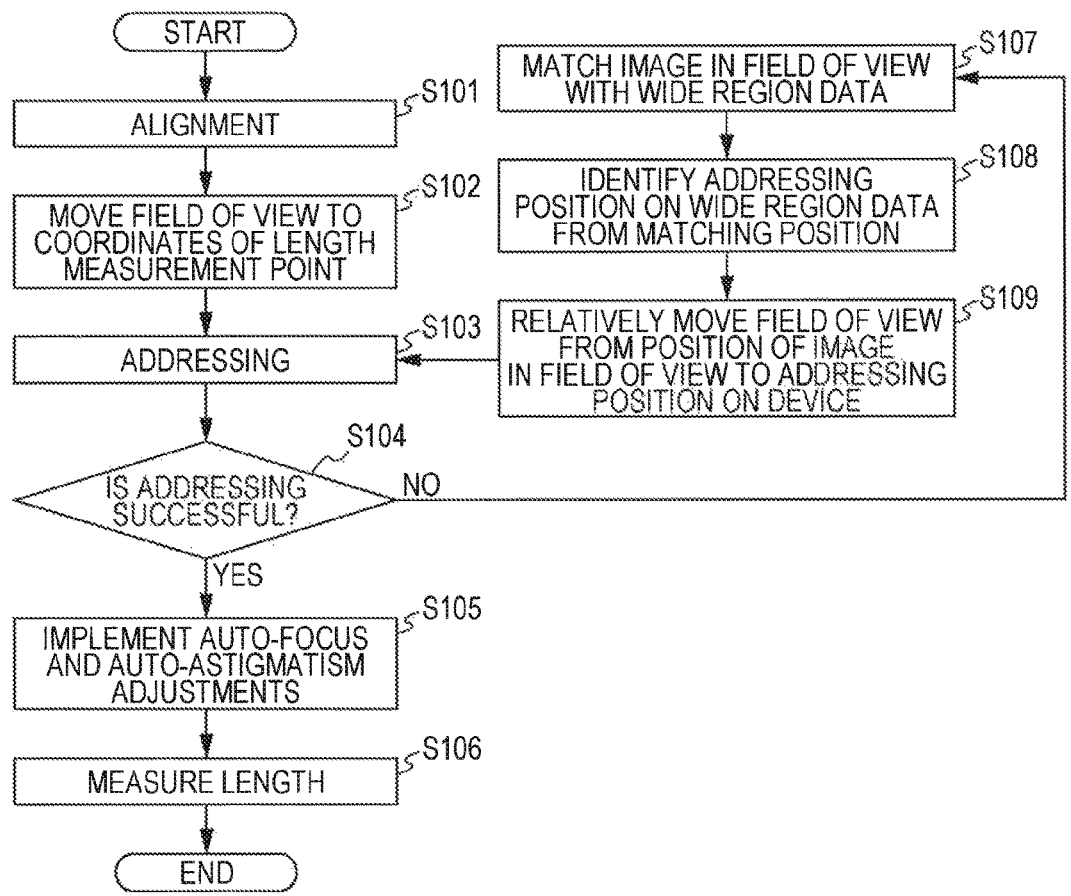
FIG. 3 is a flow chart showing an example of a measurement process by the scanning electron microscope.

A length measurement process implemented by the scanning electron microscope will be described with reference to FIG. 3. A procedure of the length measurement process, a setting condition, and the like are preset as a recipe. Therefore, a length of a pattern is measured by implementation of the recipe. A general recipe implementation process will be described. At step S101, alignment is implemented. At step S102, the field of view is moved to coordinates of a length measurement point. As a result, the field of view including the measurement point is obtained. At step S103, addressing is implemented. First, an addressing pattern is searched for. At step S104, the addressing pattern is detected, and the addressing is successful. Next, the field of view is moved from the addressing pattern by a predetermined offset amount. As a result, the field of view having the measurement point (MP) disposed at the center is obtained. Note that the offset amount from the addressing pattern to the measurement point (MP) is pre-registered. At step S105, the field of view is moved from the measurement point (MP) to the auto-focus pattern, and an auto-focus adjustment is implemented. Moreover, the field of view is moved from the measurement point (MP) to the auto-stigma pattern, and an auto-stigma adjustment is implemented. A deviation between the measurement point (MP) and the auto-focus pattern, and a deviation between the measurement point (MP) and the auto-stigma pattern are pre-registered. After the auto-focus adjustment and the auto-stigma adjustment are implemented, length measurement is implemented at step S106.

A recipe implementation process according to the present embodiment will be described with reference to FIG. 3. According to the present embodiment, when a recipe is implemented, addressing is implemented at step S103. When the addressing is failed at step S104 in detection of an addressing pattern, an image in the field of view at the current position is matched at step S107 with wide region data that is created in advance. The wide region data is wide region design data including a measurement point and an addressing pattern that are prepared in advance by an operator at a time of recipe creation. At step S108, a relative position of the addressing pattern on the wide region data is identified from a matching position of the image in the field of view on the wide region data. At step S109, the position of the image in the field of view is moved to the addressing position on the device based on the result obtained at step S108. At step S103, addressing is implemented again, and an addressing pattern is detected. At step S104, the addressing is successful, and a position of the measuring point is identified.

Figure 4:
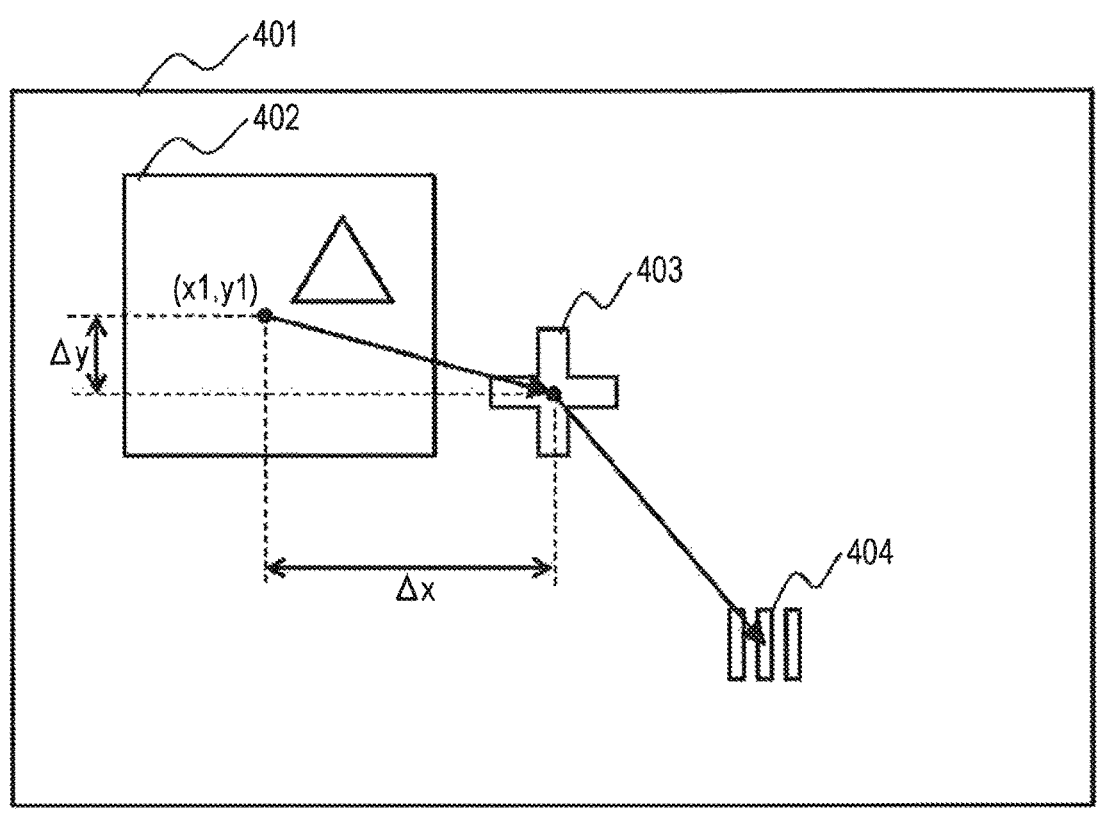
FIG. 4 is a view showing a positional relationship of an addressing pattern, a captured image, and a measurement target pattern present on wide region data.

At step S108, the relative position is calculated based on a principle exemplified in FIG. 4. Specifically, a position (x1+Δx, y1+Δy) at which an addressing pattern 403 is present on wide region data 401 is determined from a difference (Δx, Δy) between a reference position (for example, the center of an image in the field of view) (x1, y1) set by implementation of matching of a captured image 402 and the wide region data 401, and a position at which the addressing pattern 403 is present on the wide region data.

Coordinates of the addressing pattern 403 and a length measurement point 404 on the wide region data are known.

Figure 5:
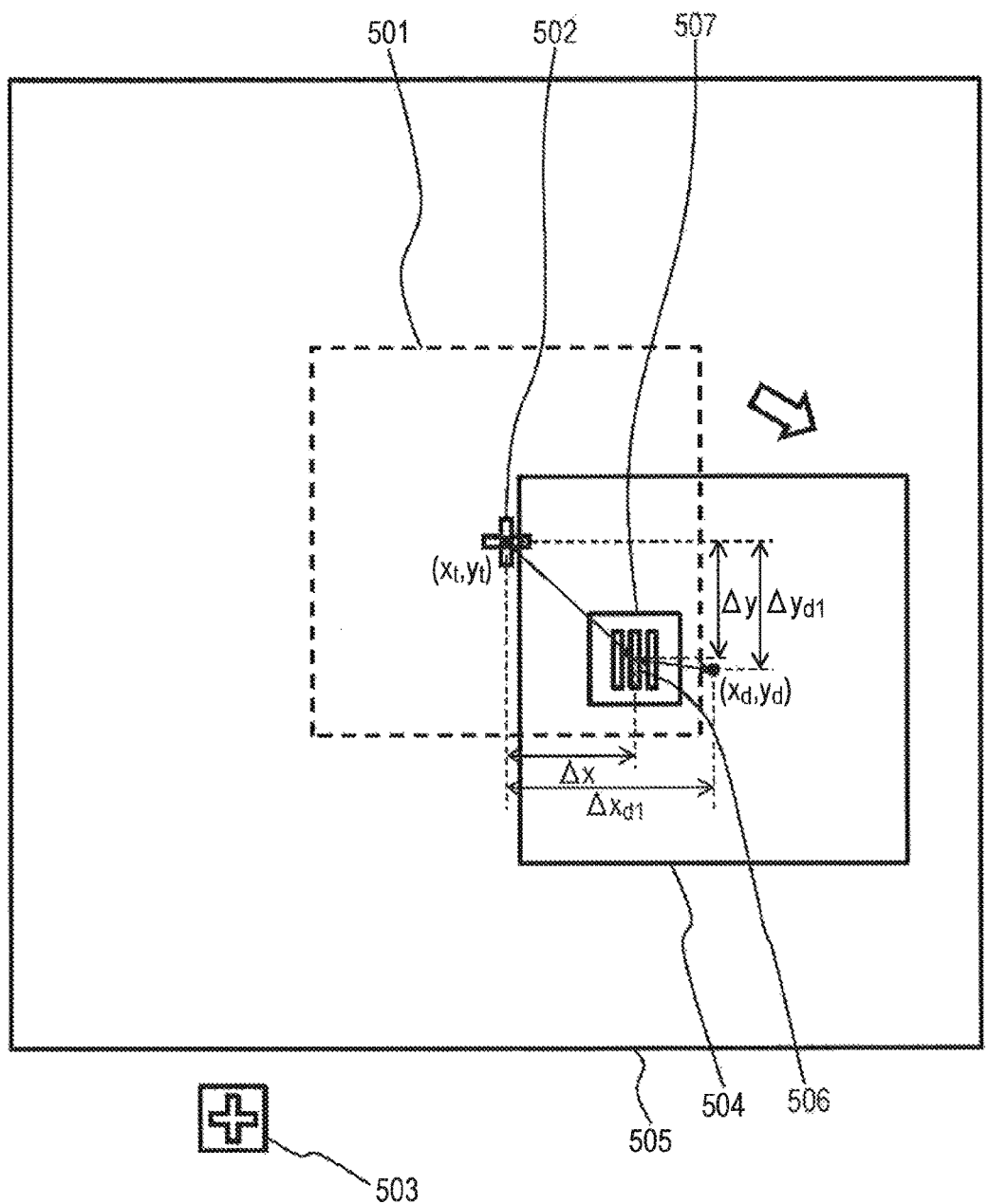
FIG. 5 is a view showing a state where no addressing pattern is displayed in a search target image.

FIG. 5 is a view showing still another example of searching in wide region data with use of a search target image (an image under search) obtained for addressing, as a template, when addressing is not successful.

FIG. 5 shows an example in which a pattern under search 502 is detected by positioning the field of view at coordinates $(x_t, y_t)$ by stage movement, obtaining an image of a region 501, and searching an image (second image) of the region 501 (a search target field of view), with use of a template 503 (first image). The pattern under search 502 and a measurement target pattern 506 have the known positional relationship (Δx, Δy). Accordingly, when the pattern under search 502 is detected in the region 501, an image of a high magnification field of view 507 can be obtained by supplying a signal for deflecting a beam by (Δx, Δy) to the deflector. When the pattern under search 502 is not at the center of the region 501 or when the pattern under search 502 is not set at the center of the region 501, a deflection signal that contains such a deviation is supplied to the deflector.

FIG. 5 shows an example in which an image of a region 504 whose field of view deviates from the position of the region 501 in a direction of an arrow 508 is obtained as a search target image.

Figure 6:
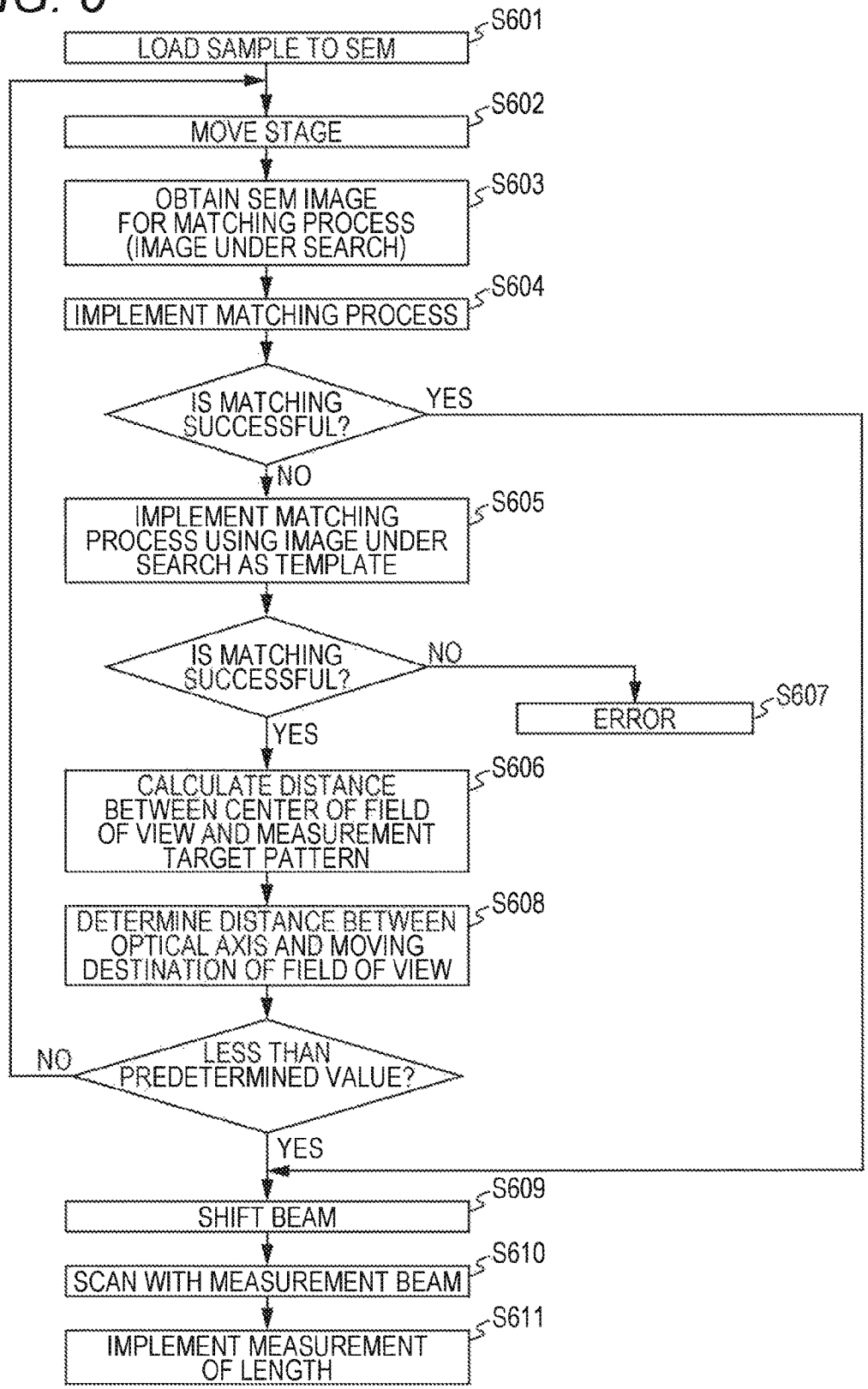
FIG. 6 is a flow chart showing an example of a measurement process by the scanning electron microscope.

FIG. 6 is a flow chart showing a measurement process for a semiconductor device. A sample is loaded into a sample chamber from which air is evacuated. After the sample is placed on the stage, the stage is driven according to a recipe condition stored in advance in the memory 905 or the like (steps S601 and S602) in this example, the stage is driven such that the center of the field of view (immediately below the optical axis of the electron beam) is positioned at the coordinates $(x_t, y_t)$. After the field of view is positioned at the coordinates $(x_t, y_t)$ a search target image is obtained(step S603).

Then, the matching process implementation section 908 implements a pattern search (matching process) using the template 503, in a search target image (step S604). On this occasion, as exemplified in FIG. 5, the pattern under search 502 is not included in the search target image of the region 504. Accordingly, the position cannot be identified, and the search fails. Note that it is determined whether the search is successful or not, for example in such a manner that when a region where a correlation value between the template and the image is a predetermined value or more is detected, the region is determined as a matching position, and when any correlation value obtained in a search region is less than the predetermined value, it is determined to be matching failure, and the process proceeds to a step of a process at a time of matching failure.

At a time of matching failure, a search process using, as a template, the image of the region 504 obtained as the search target image is implemented (step S605).

The search target image in this case is layout data created by the layout data creation section 906 based on design data stored in the design data storage medium 912, and is an image (third image) of a region larger than the region 504. Coordinate information of various sites is stored in advance in the layout data, and coordinates of the region 504 on the layout data can be identified by the search process. Moreover, in order that the layout data is searched with a high accuracy, the contour line extraction section 911 may extract contour lines of edges of the SEM image of the region 504, and the template creation section 907 may generate a template, based on the contour line image. The layout data is lines that represent contours of a pattern. Accordingly, a template with which a correlation value is calculated may also be treated as contour line data, and a correlation may be determined according to a distance of points between the template and the layout data.

As described above, layout data has coordinate information. Accordingly, coordinate information (in the example shown in FIG. 5, $(x_d, y_d)$) on layout data of a matching position can be detected. The deviation amount calculation section 909 determines a difference between $(x_d, y_d)$ and the center of the field of view $(x_t, y_t)$ on layout data that is stored in advance so as to determine a deviation $(\Delta x_{d1}, \Delta y_{d1})$ between the current position of the field of view and the position of the field of view intended to be aligned (step S606). Note that when the search process at step S605 is also failed, it is considered that the position of the field of view is largely deviated due to malfunction of the device or the like. Accordingly, the display unit or the like of the input unit 913 displays an error message (step S607).

A difference $(\Delta x-\Delta x_{d1}, \Delta y-\Delta y_{d1})$ between the current beam irradiation position and the center of the field of view for measuring the measurement target pattern is determined from the deviation amount $(\Delta x_{d1}, \Delta y_{d1})$ determined as described above, and the known distance information $(\Delta x, \Delta y)$. A deflection signal (irradiation position movement signal) corresponding to the deviation is supplied to the deflector. As a result, the beam can be deflected to the center of the high magnification field of view 507 (step S609). On the other hand, when the distance from the center of optical axis to the measurement target pattern is large, the beam largely separates from the optical axis, and an image is likely to distort. Accordingly, when the beam deflects for a predetermined distance from the optical axis, the stage is moved based on information of a difference between the optical axis and coordinate information of a moving destination. As a result, a process that brings the optical axis of the beam close to the measurement target pattern is implemented based on the information representing the difference between the optical axis and the coordinate information of the moving destination.

After the high magnification field of view 507 is positioned at the beam irradiation position, the measurement target pattern is scanned with the beam. The measurement process implementation section 910 measures the length of the measurement pattern (steps S610 and S611). Note that in the example shown in FIG. 6, after the beam is shifted at step S609, scanning with a measurement beam (high magnification observation) is implemented, but since the search target Image obtained at step S603 is a low magnification image as compared with a pre-registered template, the alignment accuracy is occasionally relatively low. In this case, after step S609, a search using the template 503 may further be implemented. The field of view is positioned at an approximately accurate position by a search using a search target image. Accordingly, a search target image obtained after the beam is shifted at step S609 is highly likely to include the pattern under search 502, and a success rate of addressing can be improved. The arithmetic processing section 904 or the control unit 902 identifies the current beam irradiation position, based on The search carried out in the search target image obtained after the beam is shifted at step S609, and generates a beam deflection signal, based on a difference between the coordinates of the current irradiation position and the coordinates of the measurement target pattern.

As described above, when addressing is failed, a search selectively using a search target image is implemented. As a result, even when an addressing error occurs, a measurement process and an inspection process can be continued.

[Embodiment 2]

According to a present embodiment, an SEM image is used for wide region data instead of design data. Steps that have modifications on those according to embodiment 1 will only be described with reference to FIG. 1 to FIG. 3.

S106: An image in the field of view at the current position is matched with a wide region SEM image that is prepared in advance. The wide region SEM image is a wide region SEM image including a measurement point and an addressing pattern that are prepared in advance by an operator at a time of recipe creation. In order to obtain an image of a wide field of view, an image is captured a low magnification. However, at low magnification, a display region per pixel becomes large, and resolution decreases. In this case, an image of a wide field of view may be generated by increasing the number of frames at a time of obtaining an image or increasing the number of pixels, and connecting high magnification images. As a result, decrease in resolution can be avoided. Addressing can be optimized by such a modification, even in a system configuration that does not use design data.

[Embodiment 3]

Figure 7:
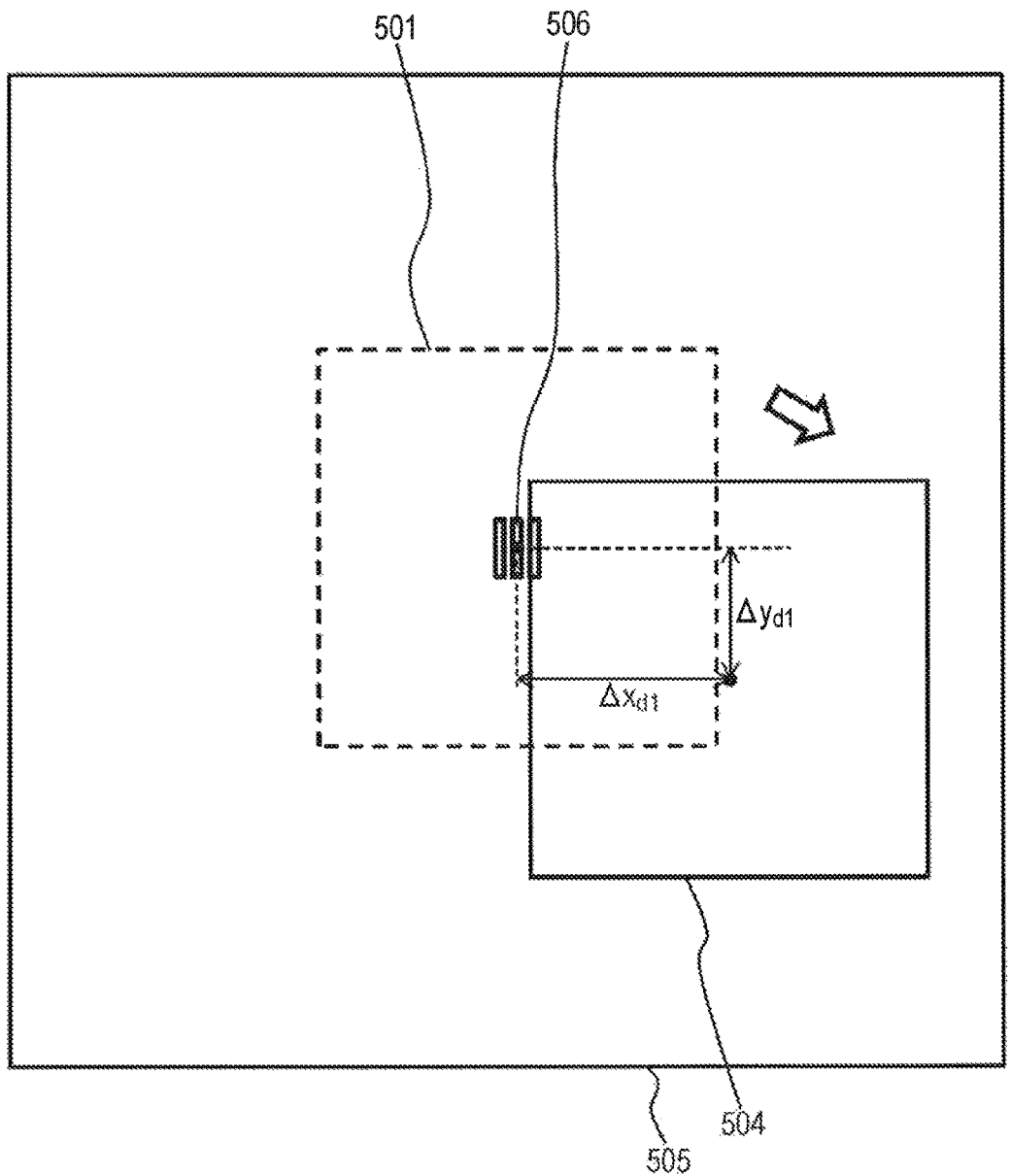
FIG. 7 is a view describing an example in which a search is implemented for wide region image data with use of an acquired SEM image as a template.

Embodiments 1 and 2 describe the example in which when the addressing is failed, the search process is implemented with use of a search target image. However, the following present embodiment describes an example in which an SEM image is obtained without implementation of addressing using a pre-registered template, and a position of the field of view is identified with use of a template that is formed based on the SEM image. FIG. 7 is a view showing an example in which when a stage is moved in order that a region 701 having the center at coordinates $(x_t, y_t)$ on a sample is irradiated with a beam, an image of a region 702 is actually obtained. In other words, FIG. 7 is a view showing a state where a position of the field of view (region 702) is set instead of an intended position of the field of view (region 701) due to influence of charging of the sample or a positioning accuracy of a stage.

Figure 8:
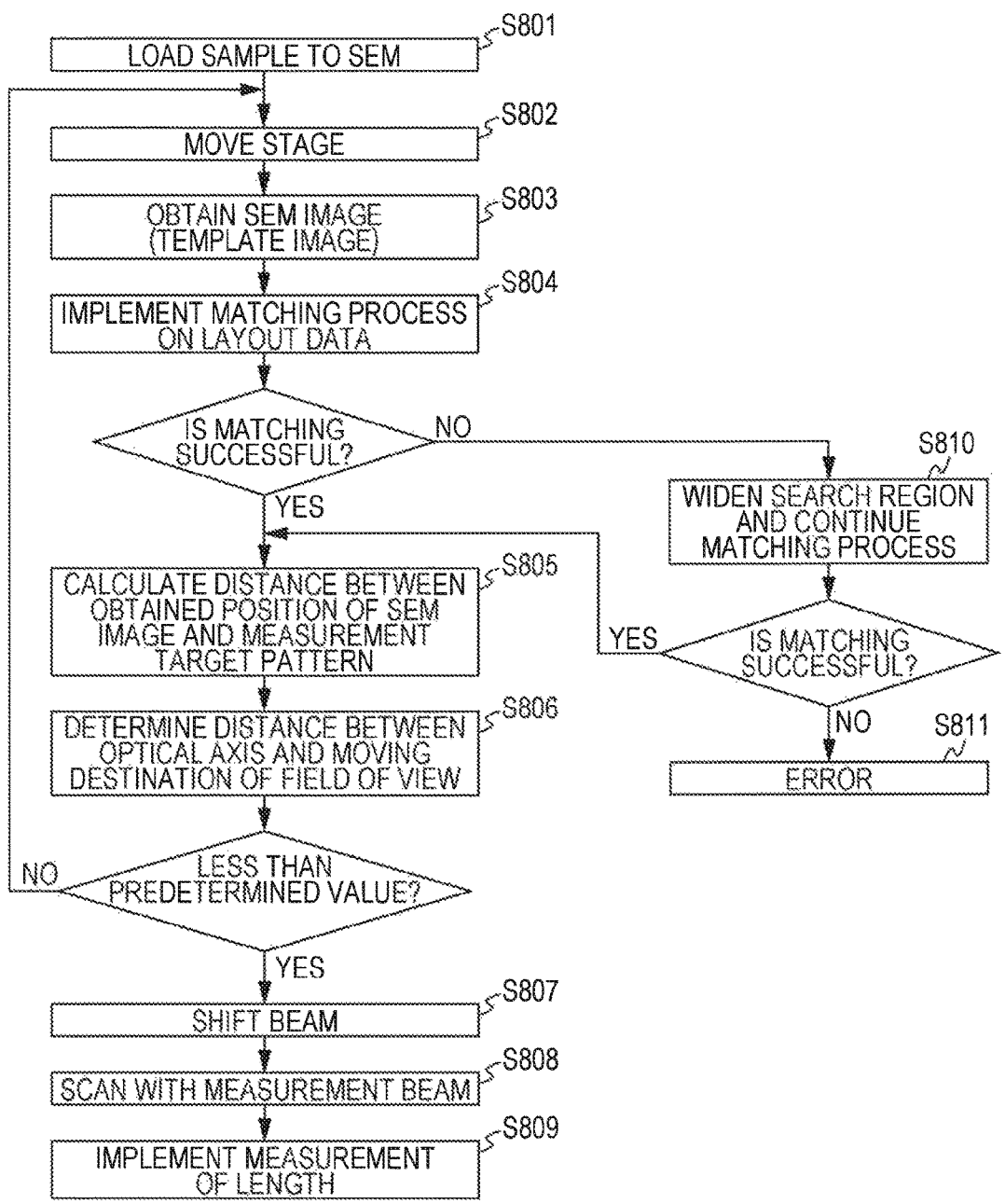
FIG. 8 is a flow chart showing an example of a measurement process by the scanning electron microscope.

FIG. 8 is a flow chart showing a process that positions a field of view intended for measurement to a measurement target pattern without using a pre-registered template. First, a sample is loaded into an SEM. A stage is moved such that an irradiation position of a beam is positioned based on pre-registered coordinate information (coordinates of a measurement target pattern) (steps S801 and S802). After the stage is moved, an SEM image is obtained (step S803). A contour line extraction section 911 implements a contour line extraction process for the SEM image and obtains a contour line image. A template creation section 907 forms a template, based on the contour line image. Further, layout data 703 of a region wider than the template is searched with use of the formed template (step S804). When matching is successful in the layout data 703, a distance $(\Delta x_{d1}, \Delta y_{d1})$ between a position $(X_d, y_d)$ of the SEM image on the layout data and center coordinates $(x_t, y_t)$ of a measurement target pattern 506 (or center coordinates of the field of view intended to be aligned) is determined (step S805).

On the other hand, when matching is failed, in other words, when a pattern that seems to he the same as a pattern included in the template cannot be detected, a search region is widened and the matching process is continued (step S810). For example, when the search region is widened, a search region having a size that is, for example, the integer multiple of a size of the original search region is set, and the widened search region other than the original search region is searched. Note that when the search process at step S810 is also failed, it is considered that the position of the field of view is largely deviated due to malfunction of the device or the like. Accordingly, a display unit or the like of an input unit 913 displays an error message (step S811).

When the matching at step S804 is successful, the beam irradiation position is deflected by ($\Delta x_{d1}$, $\Delta y_{d1}$). As a result, the center of the field of view can be positioned to the measurement target pattern 506. On the other hand, when the beam irradiation position is deflected by ($\Delta x_{d1}$, $\Delta y_{d1}$) in such a manner that a trajectory of the beam largely separates from the optical axis, an image is likely to distort. Accordingly, a distance between the optical axis and a moving destination of the field of view is determined, and when the distance exceeds a predetermined value, the stage may be moved again (step S806).

After the field of view is moved (a beam is shifted), length measurement is implemented by scanning with a measurement beam (steps S807, S808, and S809).

As described above, the matching process using an image obtained at a time of real recipe implementation is implemented. As a result, the field of view can be brought closer to a desired position without implementation of addressing.

Moreover, when a recipe that describes a plurality of measurement points included in a wide region template is created, as long as alignment (correction) using a wide region template of a measurement pattern (first point) can be accurately implemented, the stage can be directly moved to other measurement points (second and later points) in the wide region template, based on the correction amount of the first point. Accordingly, the length measurement process can be implemented for the second and later points in the wide region template without implementation of addressing after the stage is moved.

Specifically, when a plurality of measurement points in a wide region template is measured, a position of the first point may be identified with use of the wide region template. Thereafter, addressing may be implemented. Positions of the second and later points may be identified with use of the wide region template. In addition, the position of the field of view at each of the second and later points may be aligned based on position deviation information identified by the addressing of the first point.

Note that the present invention is not limited to the above-described embodiments, but includes various modifications. For example, the above-described embodiments are described in details for the purpose of facilitating understanding of the present invention, and are not necessarily limited to those that include all the described configurations. Moreover, a part of the configuration of one embodiment can be substituted with the configuration of another embodiment. Moreover, the configuration of one embodiment can be added to the configuration of another embodiment. Moreover, a part of the configuration of each embodiment can be added to, omitted from, and/or substituted with the configuration of another embodiment. Moreover, part or all of the above described configurations, functions, processing sections, processing means, and the like may be realized by hardware such as designing of an integrated circuit. Moreover, the above-described configurations, functions, and the like may be realized by software in which a processor interprets a program that realizes these functions and executes them. Information such as a programs, a table, and a file that realize each function can be placed in a recording unit such as a memory, a hard disk, or an SSD (Solid State Drive), or a recording medium such as an IC card, an SD card, or a DVD.

What is claimed is:

1. A charged particle beam device for forming an image based on detection of charged particles obtained by scanning a sample with a charged particle beam, the device comprising:
   a detector configured to detect the charged particles obtained by scanning the sample with the charged particle beam;
   a deflector configured to deflect the charged particle beam;
   a stage configured to move the sample;
   an image processor configured to form the image based on an output of the detector;
   a control computer to which the image processor is coupled; and
   a memory storing a program causing the control computer, when executed, to:
   search a second image that is a search target image with use of a first template generated from an first image; and
   when a region corresponding to the first image is not detected in the second image, search a third image that represents a region larger than a region displayed in the second image, with use of the second image or a second template formed based on the second image,
   wherein the control computer controls at least one of the deflector and the stage so as to position an irradiation position of the charged particle beam to a desired position, with use of position information detected by the first template or the second template.

2. The charged particle beam device according to claim 1, wherein after the control computer implements the search using the second template, the control computer implements again a search using the first image.

3. The charged particle beam device according to claim 1, wherein the control computer determines an irradiation position movement signal of the charged particle beam, based on coordinates identified by a search using the second image or the second template and coordinates identified by a search using the first image.

4. The charged particle beam device according to claim 3, further comprising:
   a deflector that deflects an irradiation position of the charged particle beam,
   wherein the deflector deflects the charged particle beam, based on the irradiation position movement signal.

5. A charged particle beam device for forming an image based on detection of charged particles obtained by scanning a sample with a charged particle beam, the device comprising:
   a detector configured to detect the charged particles obtained by scanning the sample with the charged particle beam;
   a deflector configured to deflect the charged particle beam;
   a stage configured to move the sample;
   an image processor configured to form the image based on an output of the detector;
   a control computer to which the image processor is coupled; and
   a memory storing a program causing the control computer, when executed, to:
   create a first template, based on a first image that is generated based on a detection signal obtained by scanning with the charged particle beam;

search a second image that represents a region larger than a region displayed in the first image, with use of the first template; and determine an irradiation position movement signal of the charged particle beam, based on a deviation between a first position detected by the search and a pre-registered second position, wherein the control computer controls at least one of the deflector and the stage so as to move an irradiation position of the charged particle beam by the irradiation position movement signal.

\* \* \* \* \*